United States Patent [19]
Park

[11] Patent Number: 5,548,344
[45] Date of Patent: Aug. 20, 1996

[54] DEMODULATING SYSTEM FOR HIGH-DEFINITION TELEVISION RECEIVER

[75] Inventor: Hee B. Park, Kyungki-do, Rep. of Korea

[73] Assignee: LG Electronics Inc., Seoul, Rep. of Korea

[21] Appl. No.: 371,069

[22] Filed: Jan. 10, 1995

[30] Foreign Application Priority Data

Apr. 12, 1994 [KR] Rep. of Korea ............... 1994-7632

[51] Int. Cl.$^6$ .................................. H04N 5/455
[52] U.S. Cl. ............................ 348/726; 348/536
[58] Field of Search ..................... 348/725, 726, 348/727, 500, 536, 537

[56] References Cited

U.S. PATENT DOCUMENTS 4,683,495  6/1987  Erickson .................. 331/25

Primary Examiner—Victor R. Kostak
Assistant Examiner—Nathan J. Flynn
Attorney, Agent, or Firm—Finnegan, Henderson, Farabow, Garrett & Dunner, L.L.P.

[57] ABSTRACT

A demodulating system for a high definition television (HDTV) that includes a tuning circuit for selecting one out of a plurality of received radio frequency (RF) signals and for converting the selected signal into an intermediate frequency (IF) signal according to an input loop-controlling signal. An oscillating circuit generates a sine wave signal. A filtering circuit passes only a pilot signal containing HDTV carrier information from the IF signal and cancels the remainder. A FPLL circuit for using a predetermined algorithm to form a loop-controlling signal for synchronizing the frequency and phase of the pilot signal and the frequency and phase of the sine wave and providing the loop-controlling signal to the tuning circuit.

6 Claims, 8 Drawing Sheets

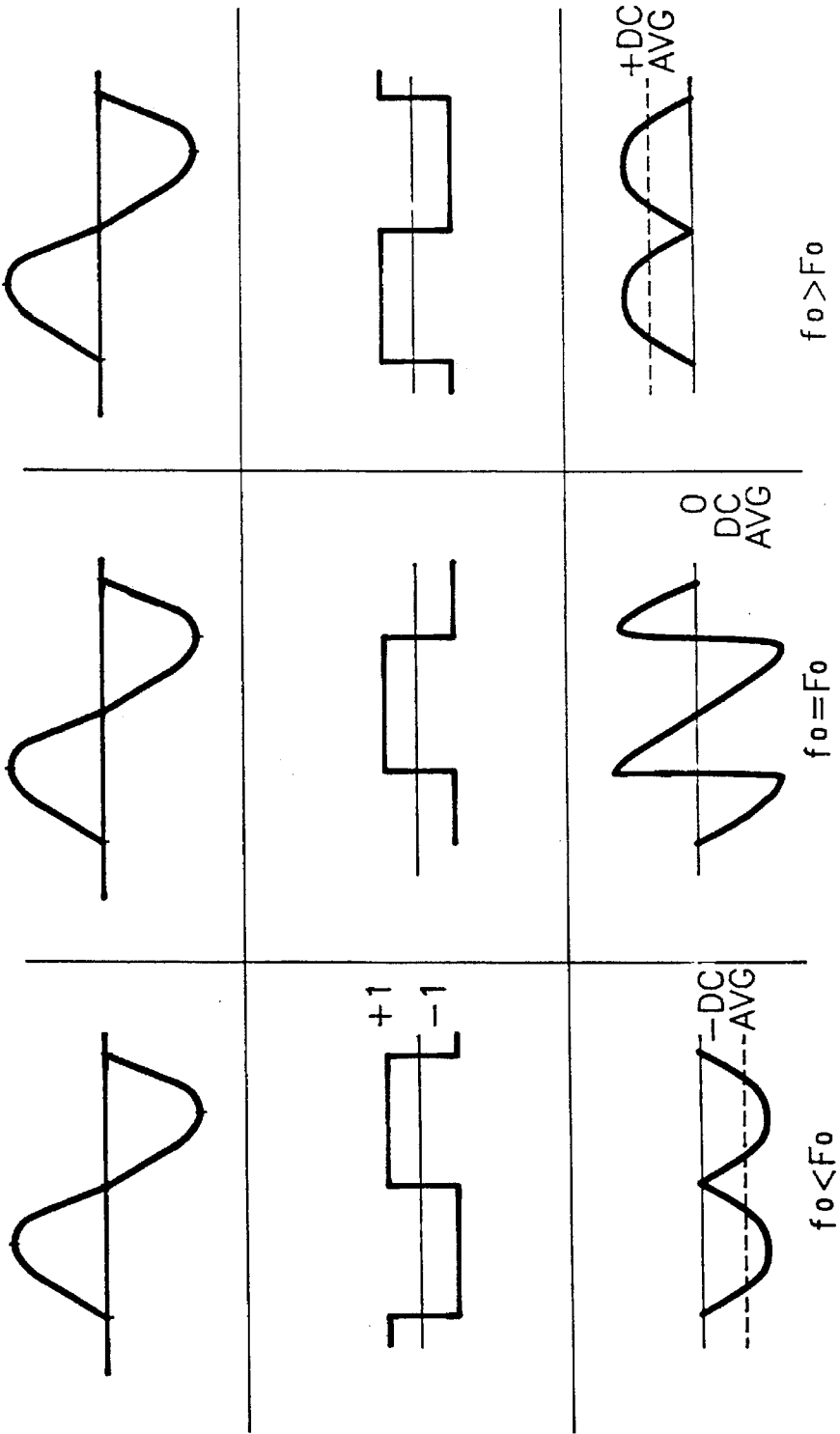

DEMODULATING SYSTEM FOR HIGH-DEFINITION TELEVISION RECEIVER

BACKGROUND OF THE INVENTION

1. Field of the Invention

The present invention relates to a high-definition television receiver, and more particularly, to a demodulating system for a high-definition (HD) television receiver.

2. Discussion of Related Art

In the vestigial side band (VSB) system which is selected for the United States HD television transmission system format, a frequency and phase locked loop (FPLL) is used for the synchronization of the carrier.

The FPLL recovers the frequency and phase of a carrier selected by a tuner out of a plurality of radio frequency (RF) signals received via an antenna. The carrier recovered by the FPLL is used as a loop-controlling signal for converting the RF signals received by the tuner into signals of a low band.

FIG. 1 is a block diagram of an HDTV demodulating system used by America's Zenith Co., Ltd. The system comprises a tuning circuit 10 for selecting one out of a plurality of RF signals and converting the selected carrier into an intermediate frequency signal according to an input loop-controlling signal, an oscillating circuit 20 for generating a sine signal, and a FPLL 30 for sending the loop-controlling signal for synchronizing the phase and frequency of the intermediate frequency signal including the carrier selected to the tuning circuit 10, using an algorithm to determine the phase and frequency of the sine wave output from the oscillating circuit 20, and outputting this information from the tuning circuit 10.

In FIG. 1, tuning circuit 10 includes an antenna 10a for receiving a plurality of RF signals, a double conversion tuner 10b, a channel selector 10c, serving as a first oscillator for selecting, according to a user's selection, one of the RF signals received by the double conversion tuner 10b, and converting the selected carrier into a first intermediate frequency signal. A voltage controlled oscillator (VCO) 10d, serving as a second oscillator for converting the first intermediate frequency signal into a second intermediate frequency signal with a frequency band within a reasonable range for a general circuit is also included. Further, a SAW filter 10e for filtering the second intermediate frequency signal output via the double conversion tuner 10b is included along with an amplifier 10f for amplifying the second intermediate frequency signal output from the SAW filter 10e.

FPLL 30 comprises a phase shifter 30a for shifting the phase of the sine wave output from the oscillating circuit 20 by a predetermined angle (here, 90°); a multiplier 30b for multiplying the second intermediate frequency signal, output from the tuning circuit 10, by the output signal of the phase shifter 30a and outputting the product as an I-channel beat signal; a multiplier 30c for multiplying the sine wave signal output from the oscillating circuit 20 by the second intermediate frequency signal output from the tuning circuit 10 and outputting the product as a Q-channel beat signal; an automatic filtering control (AFC) low-pass filter 30d for passing only a predetermined low band of a signal out of the I-channel beat signal and changing the phase of the signal according to the frequency of the I-channel beat signal; a limiter 30e for amplifying and limiting the output signal of the AFC low-pass filter 30d to a predetermined amplification degree; a multiplier 30f for multiplying the output signal of multiplier 30c by the output signal of the limiter 30e; and an automatic phase control (APC) low-pass filter 30g for passing only a predetermined low frequency band of signal out of the output signal of multiplier 30f and providing the passed signal to VCO 10d of tuning circuit 10, as a loop-controlling signal for correcting the frequency of a selected carrier.

In FIG. 1, FPLL 30 may further comprise an analog-to-digital (A/D) converter 30h for converting the I-channel signal output from the I-channel multiplier 30b into a digital signal and sending it to another channel block.

The operation of the demodulating system of FIG. 1 will be described. Out of a plurality of RF signals received via antenna 10a, one carrier is selected by the channel selector 10c in the double conversion tuner 10b and converted into a first intermediate frequency (IF) signal.

The first IF signal is designed to fall within a frequency band which does not interfere with other RF channel signals. The first IF signal is converted into a second IF signal by the second oscillator, VCO 10d, via an amplifier and a band-pass filter (not shown) of the double conversion tuner 10b.

The second IF frequency signal has a frequency band within a reasonable range for a general circuit and the signal does not interfere with other RF channel signals, even though the signal is greatly amplified and filtered.

The IF frequency band is used because, in detecting the RF signal as a low-band signal, there is reduced distortion to the video signal, as compared to using a RF signal directly converted into a low-band signal or using a RF signal that is first converted into an IF signal, filtered and amplified, and then converted into the low-band signal.

The second IF signal output from the double conversion tuner 10b is converted into an appropriate form by the SAW filter 10e and the IF amplifier 10f. The IF signal carrier is multiplied by the sine wave output from the final oscillator, oscillating circuit 20, in multipliers 30b and 30c of the FPLL 30, and then converted into a low-band signal.

FPLL 30 generates two channel signals, an I-channel signal and a Q-channel signal. They have a predetermined phase difference (here, 90°).

The I-channel signal out of the low-band signals is digitalized by the A/D converter 30h and output to another channel block for video data detection.

In order for the I-channel signal to conform to the low-band signal sent from a broadcasting station, the frequency and phase of the sine wave output from the HDTV oscillator 20 must coincide precisely with the frequency and phase of the final signal of the IF signal carrier selected and output from the tuning circuit 10. One way to properly adjust the frequency and phase is to first set one of the signals between the sine wave of the oscillating circuit 20 and the IF signal carrier, and then set the other signal.

The system of FIG. 1 sets the oscillating circuit 20 signal as a reference oscillator and the frequency and phase of the IF signal carrier is changed to match. In order to change the frequency and phase of the final IF signal carrier, the oscillating frequency of VCO 10d, which forms the second IF signal, is altered.

The direction and magnitude of the oscillating frequency of VCO 10d is obtained by operating the FPLL in accordance with an algorithm for generating the I-channel signal and Q-channel signal, which are both low-band signals. The purpose of the FPLL 30 is to determine the direction and magnitude of frequency signals. The operation of FPLL 30 will be described below.

If the frequency of the final IF carrier signal is not the same as that of the sine wave output from the oscillating circuit 20, a beat, corresponding to the difference between the two frequencies, is large at a low band.

The sine wave of oscillating circuit 20 has a phase difference of 90° in I-channel multiplier 30b and Q-channel multiplier 30c according to the phase shifter 30a, and multiplied by the final IF signal. As a result, the I-channel beat signal and the Q-channel beat signal have a phase difference of 90°. For the discussion below, assume the Q-channel beat signal is a waveform as shown at the top of FIGS. 2A, 2B and 2C.

The I-channel beat signal passes the AFC low-pass filter 30d having the circuit configuration of FIG. 3A and the characteristics of FIG. 3B. The AFC low-pass filter functions to change the phase of the signal according to the frequency of the I-channel beat signal.

As shown in FIG. 3B, if the I-channel beat signal has a frequency $f_1$, its phase is shifted by 90°.

When the output signal of AFC low-pass filter 30 is amplified and passed through the limiter 30e, its waveforms correspond to those in the middle of FIGS. 2A, 2B and 2C.

Multiplier 30f of FPLL 30 multiplies the waveforms at the top of FIGS. 2A, 2B and 2C and the waveforms in the middle thereof, to output the waveforms shown at the bottom of FIGS. 2A, 2B and 2C.

The signals output from multiplier 30f are input to VCO 20 10d of the tuning circuit 10 through the APC low-pass filter 30g, to correct the signals oscillating frequencies to the intended frequencies. The output signal of the APC low-pass filter 30g corresponding to the waveforms at the bottom of FIGS. 2A, 2B and 2C is the output signal of FPLL 30 and called a loop-controlling signal.

Given that the frequency of the sine wave output from the oscillating circuit 20 is $F_0$ and the frequency of the final IF signal carrier of the selected carrier is $f_0$. FIG. 2A shows waveforms for when $f_0 < F_0$. FIG. 2B shows waveforms for when $f_0 \cong F_0$. FIG. 2C shows waveforms for when $f_0 > F_0$.

FPLL 30 will be explained in more detail. If $f_0$ and $F_0$ are approximate values and the frequency $f_1$ of the I-channel beat signal is very low, the phase shift of the signal output from AFC low-pass filter 30d is very small. Therefore, the I-channel beat signal and Q-channel beat signal maintain a phase difference of 90° as in the initial state. Multiplier 30f multiplies the Q-channel beat signal by the limited I-channel beat signal and provides the FPLL output signal whose average is "0" as the loop-controlling signal as shown in FIG. 2A.

If $F_0 - f_0 = f_1$ and does not equal zero, then in a frequency synchronization process, the phase shifts in the positive direction in proportion to the frequency difference $f_1$ in AFC low-pass filter 30d. Here, the FPLL output signal is the same as FIG. 2A.

If $F_0 - f_0 = f_l$ and does not equal zero, then in another frequency synchronization process, the phase shifts in the negative direction are in proportion to frequency difference $f_1$. The output signal of FPLL 30 is as shown in FIG. 2C.

As a result, the FPLL output draws a "S" curve as shown in FIG. 4 according to the frequency variation of the I-channel beat signal. The central point of the "S" curve is $F_0 = f_0$.

If $F_0$ and $f_0$ have the same frequencies but different phases, in the phase synchronization process shown in FIG. 5, the limited I-channel beat signal maintains value "1" and the Q-channel beat signal has a value proportional to the magnitude of the phase difference θ.

The Q-channel-loop of FIG. 1 has the same characteristic as a general PLL loop and acts to reduce the phase difference θ.

The output signal of FPLL 30 converges to "0" as shown in FIG. 5. FPLL 30 of the demodulating system of FIG. 1 uses the beat signals of the sine wave of the oscillating circuit 20, and the selected carrier, to extract a loop-controlling signal for synchronizing the frequency and phase of the carrier and reference sine wave. However, the IF signal contains general information data as well as the carrier, and it is difficult to extract clear I-channel beat signals and Q-channel beat signals as shown in the waveforms at the top of FIGS. 2A, 2B and 2C.

HDTV broadcasting is standardized to simulcast with the conventional NTSC broadcasting. If there is an interference of a NTSC broadcasting signal, which commonly uses the HDTV broadcasting channel, as shown in FIG. 6, a NTSC video carrier, as an interference wave, generates beat signals with the sine wave signal output from the oscillating circuit 20, similar to the carrier of an intended HDTV channel. In this case, the FPLL 30, which has the function of synchronizing the frequency and phase, is unable to perform the synchronization of the carrier of the HDTV channel.

In order to preclude the interference of the NTSC video carrier, America's Zenith Co. proposed an HDTV demodulating system as shown in FIG. 7.

This demodulating system is similar but partly different from the system of FIG. 1.

The portion of the demodulating system of FIG. 7 similar to FIG. 1 comprises the tuning circuit 10, the oscillating circuit 20 and the FPLL 30. This demodulating system further comprises two identical blocks 30A and 30B added to the I channel and the Q channel of FPLL 30 in order to remove the NTSC video carrier.

Block 30A is inserted between I-channel multiplier 30b and AFC low-pass filter 30d, whereas block 30B is inserted between Q-channel multiplier 30c and multiplier 30f.

Block 30A comprises an A/D converter 30i for converting a beat signal into a digital signal, an NTSC removing filter 30j for removing the NTSC video carrier, shown in FIG. 6, out of the output signals of the A/D converter 30i, and a D/A converter 30k for converting the output signal of the NTSC removing filter 30j into an analog signal.

Block 30B removes the NTSC video carrier in the Q channel and also includes an A/D converter 30l, an NTSC removing filter 30m and a D/A converter 30n.

NTSC removing filters 30j and 30m, as is well-known in the art, are digital comb filters. For this reason, in order to operate the NTSC removing filters 30j and 30m, A/D converters 30i and 30l for digitalizing the I-channel beat signal and the Q-channel beat signal are coupled to the input of the filters. D/A converters 30k and 30n are connected to the output of the NTSC removing filters 30j and 30m in order to process the I-channel beat signal and the Q-channel beat signal, from which the NTSC video carrier is removed, using an analog signal.

In the configuration of FIG. 7, in order to remove the interference of the NTSC video carrier and improve the performance of the FPLL 30, digital processing portions such as a D/A converter and an A/D converter are added in the FPLL, resulting in complicated hardware. Further, this configuration increases the probability that digital noise will be output as analog noise.

SUMMARY OF THE INVENTION

The present invention has been made in view of the above circumstances and has as an object to provide a demodulating system for a HDTV which removes unnecessary signals and leaves only an IF signal of a HDTV pilot signal and a NTSC video carrier for input into an FPLL, thereby enhancing the performance of the FPLL and not complicating the hardware.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the demodulating system for a DHTV, of this invention comprises a tuning system for selecting one out of a plurality of received radio frequency (RF) signals and for converting the selected signal into an intermediate frequency (IF) signal according to an input loop-controlling signal, an oscillating circuit for generating a sine wave signal, filtering means for passing only a pilot signal containing HDTV carrier information filtered out of the IF signal and canceling any remaining signals, and frequency and phase locked loop (FPLL) means for using a predetermined algorithm to determine a loop-controlling signal for synchronizing the frequency and phase of the pilot signal and the frequency and phase of the sine wave and outputting the loop-controlling signal to the tuning system.

BRIEF DESCRIPTION OF THE DRAWINGS

The accompanying drawings, which are incorporated in and constitute a part of this specification illustrate embodiment(s) of the invention and, together with the description, serve to explain the objects, advantages and principles of the invention. In the drawings.

FIGS. 2A, 2B and 2C are operation waveforms at respective portions of the FPLL shown in FIG. 1;

DETAILED DESCRIPTION OF THE PREFERRED EMBODIMENT

Figure 8:
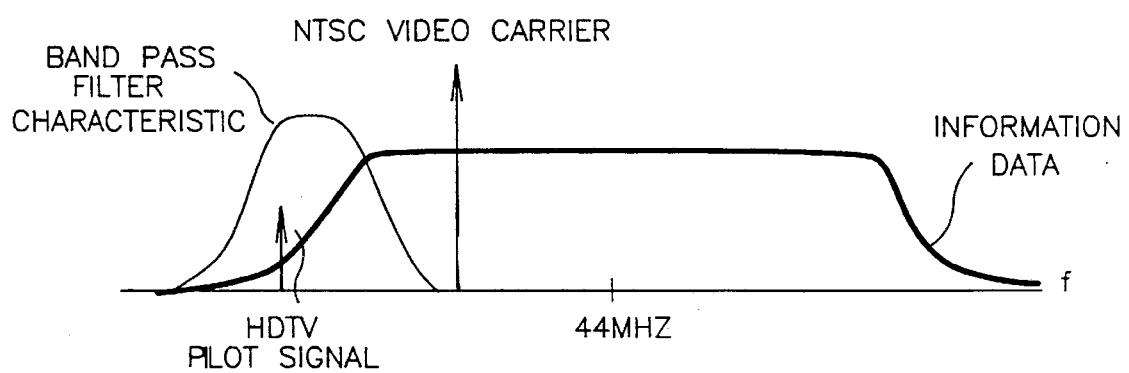
FIG. 8 is a diagram of the characteristics of the band-pass filter used in the present invention.

In FIG. 8, a low-band signal is composed of information data and a pilot signal, which is a sine wave signal on a transmission side. If an NTSC video signal is present on the same channel as the low-band signal and there is interference in a NTSC common channel, a NTSC video carrier is loaded on the information data area of HDTV as a signal that is similar in size to the relatively large HDTV pilot signal. For efficient performance of the FPLL, only the pilot signal is required and the other signals may be canceled.

For passing only the pilot signal out of the HDTV IF signal, as shown in FIG. 8, a filtering means, such as a band-pass filter, may be tied to the output of the tuning circuit.

Figure 9:
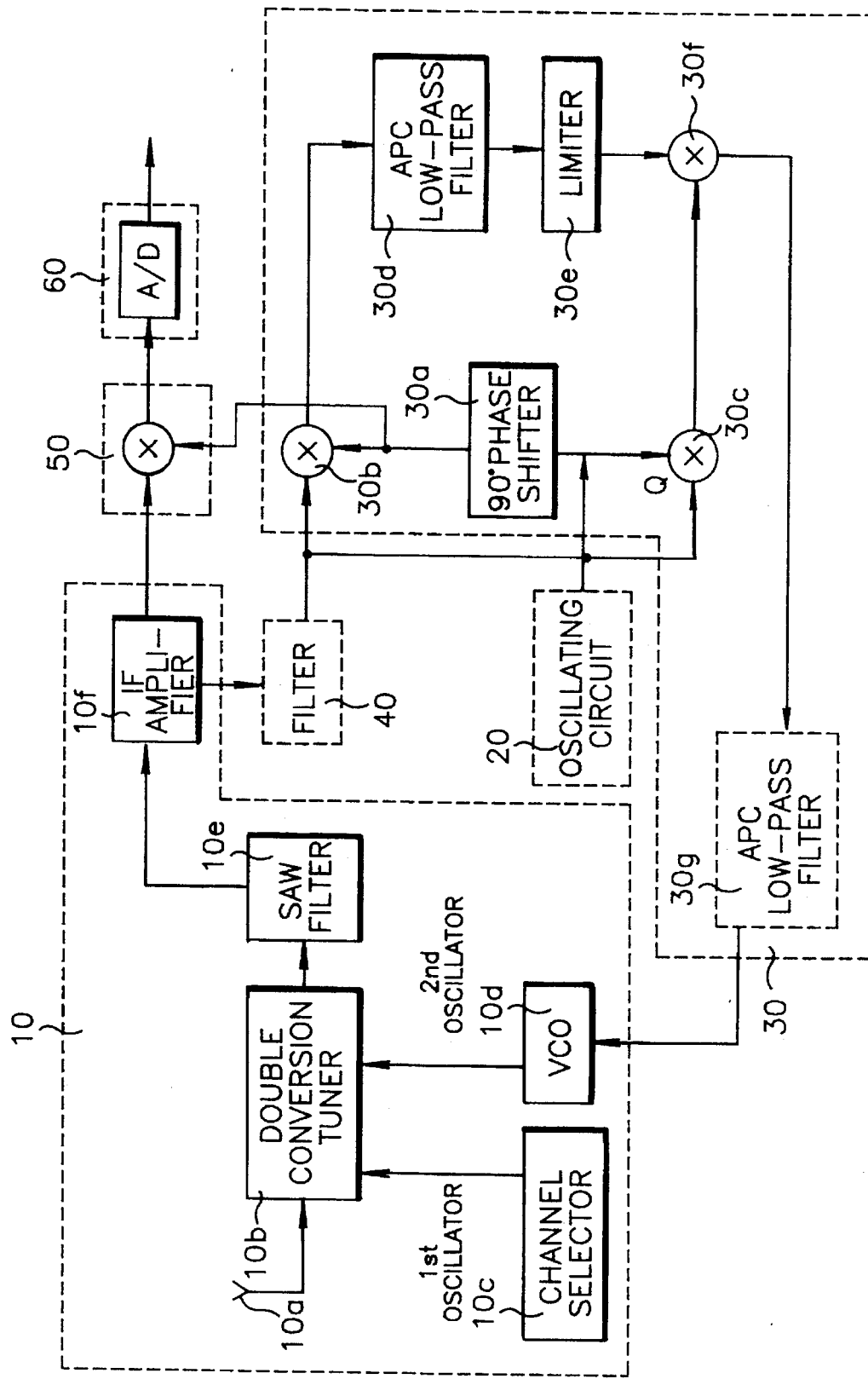
FIG. 9 is a block diagram of a demodulating system for the HDTV of the present invention.

In FIG. 9, the demodulating system comprises a tuning system 10 for selecting one signal out of a plurality of received RF signals and for converting the selected signal into an IF signal according to an input loop-controlling signal. An oscillating circuit 20 generates a sine wave signal. Filtering circuit 40 passes only a pilot signal containing HDTV carrier information out of the IF signal and cancels the remainder. FPLL 30 uses a predetermined algorithm to form a loop-controlling signal for synchronizing the frequency and phase of the pilot signal and the frequency and phase of the sine wave, and for providing the loop-controlling signal to the tuning circuit 10. A multiplier 50 multiplies the sine wave signal, phase-shifted by a predetermined angle (90°), in FPLL 30 and output from oscillating circuit 20 by the IF signal output from tuning circuit 10, thereby to form a low-band signal. An A/D converter 60 converts the low-band signal output from multiplier 50 into a digital signal for use in further digital signal processing.

Figure 1:
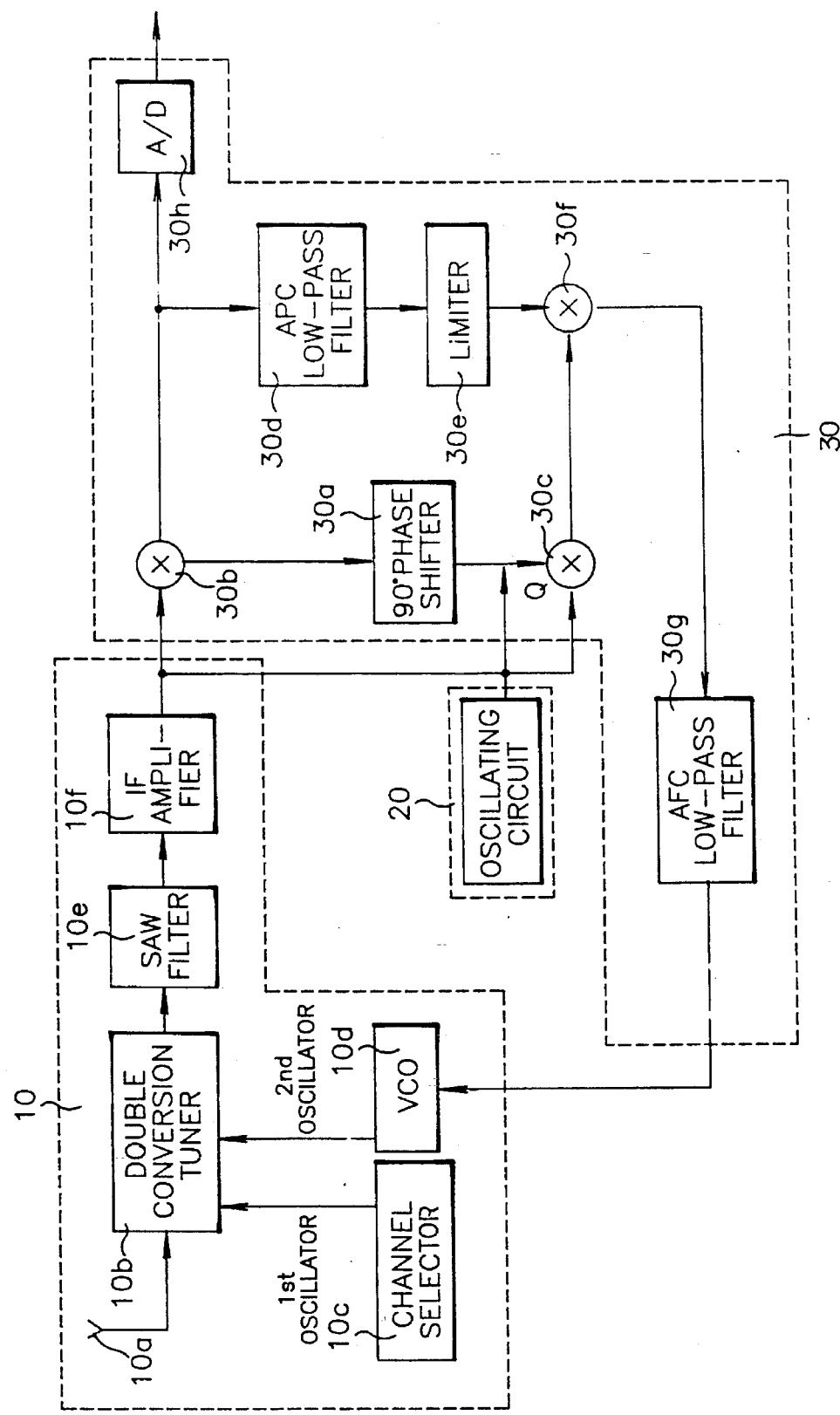
FIG. 1 is a block diagram of a conventional demodulating system for a HDTV receiver.
Figure 3A:
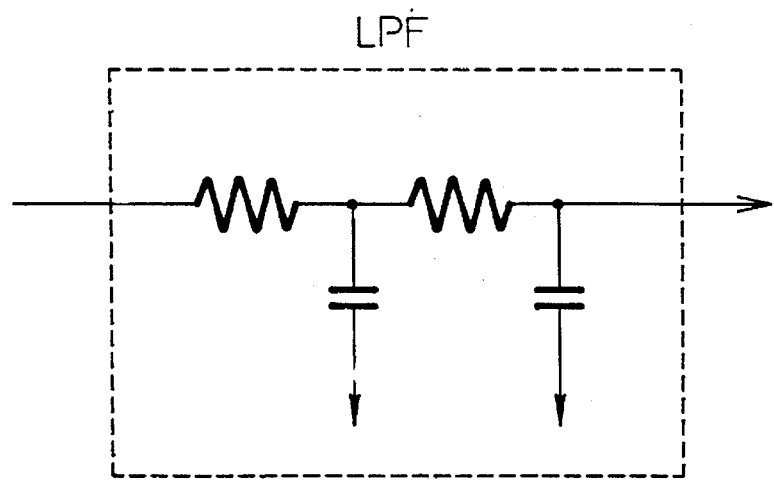
FIG. 3A is a circuit diagram of the AFC low-pass filter of FIG. 1.
Figure 3B:
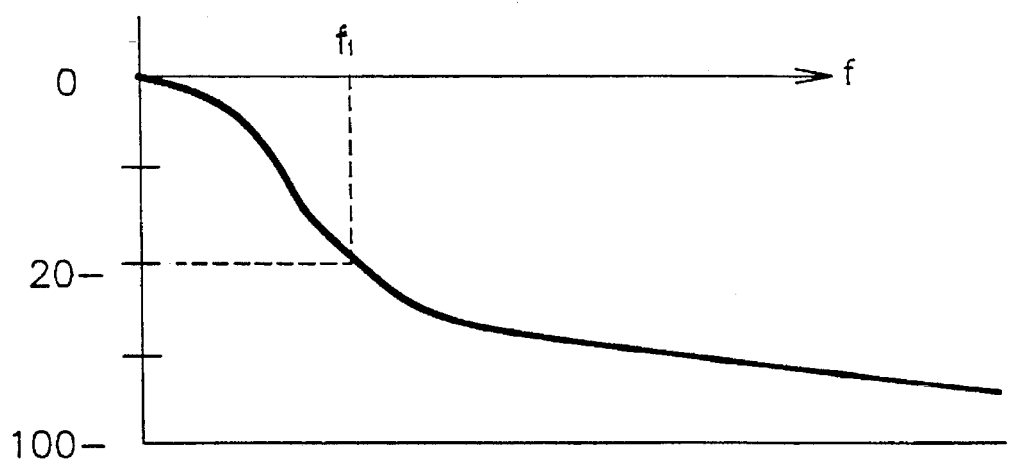
FIG. 3B is a frequency characteristic diagram of the AFC low-pass filter of FIG. 1.
Figure 4:
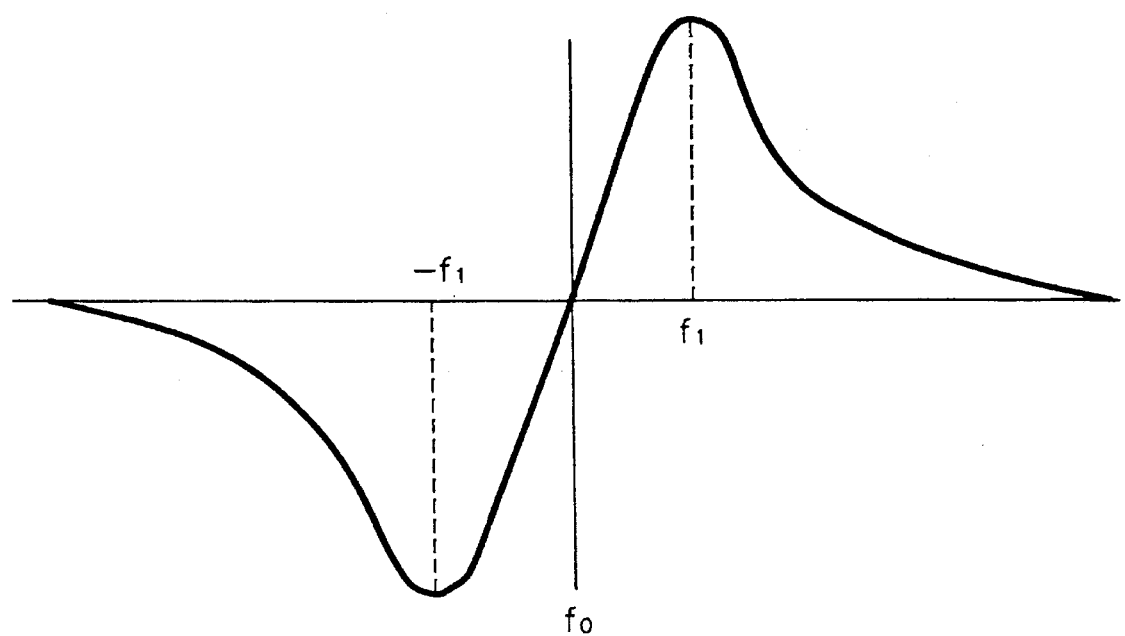
FIG. 4 is an "S" curve diagram showing the characteristics of the FPLL of FIG. 1.
Figure 5:
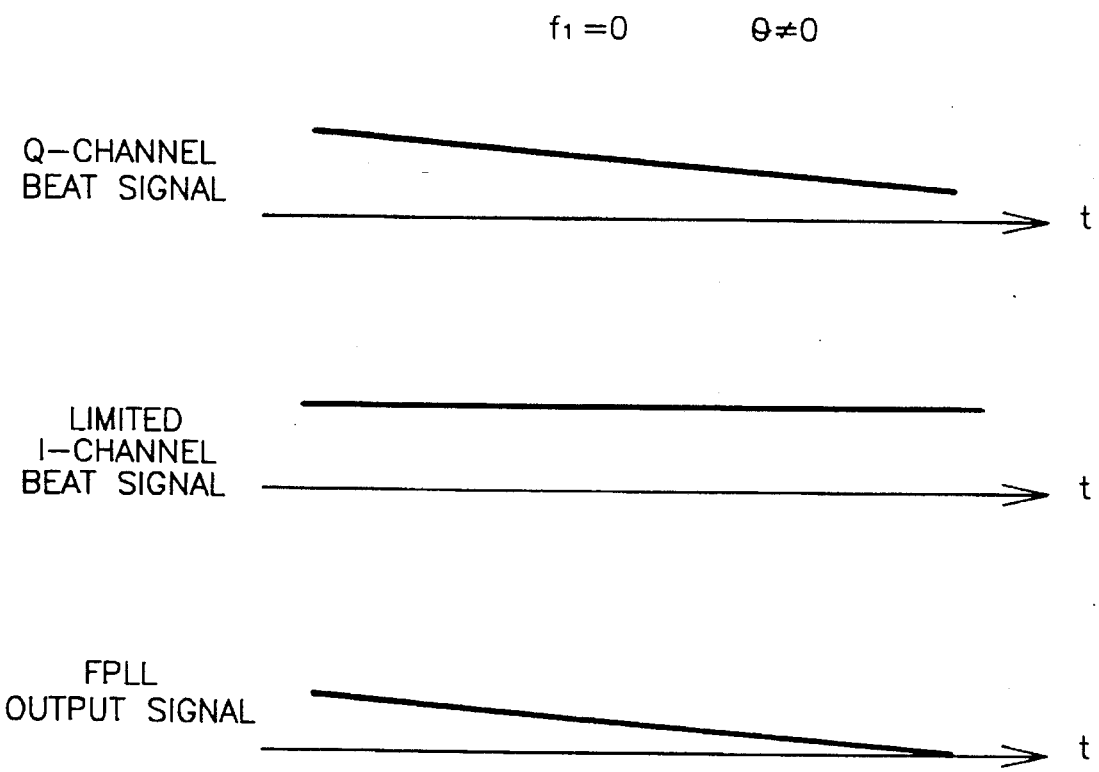
FIG. 5 is a graph showing the phase synchronizing process of the FPLL shown in FIG. 1.
Figure 6:
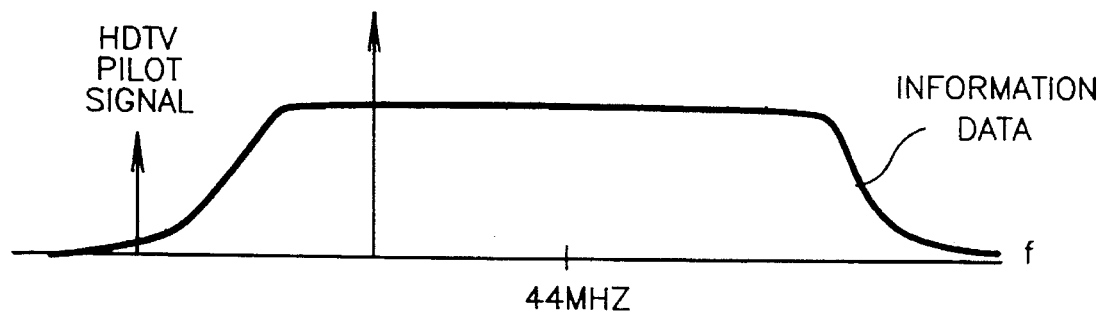
FIG. 6 is a diagram of the signals contained in the low-band signals.
Figure 7:
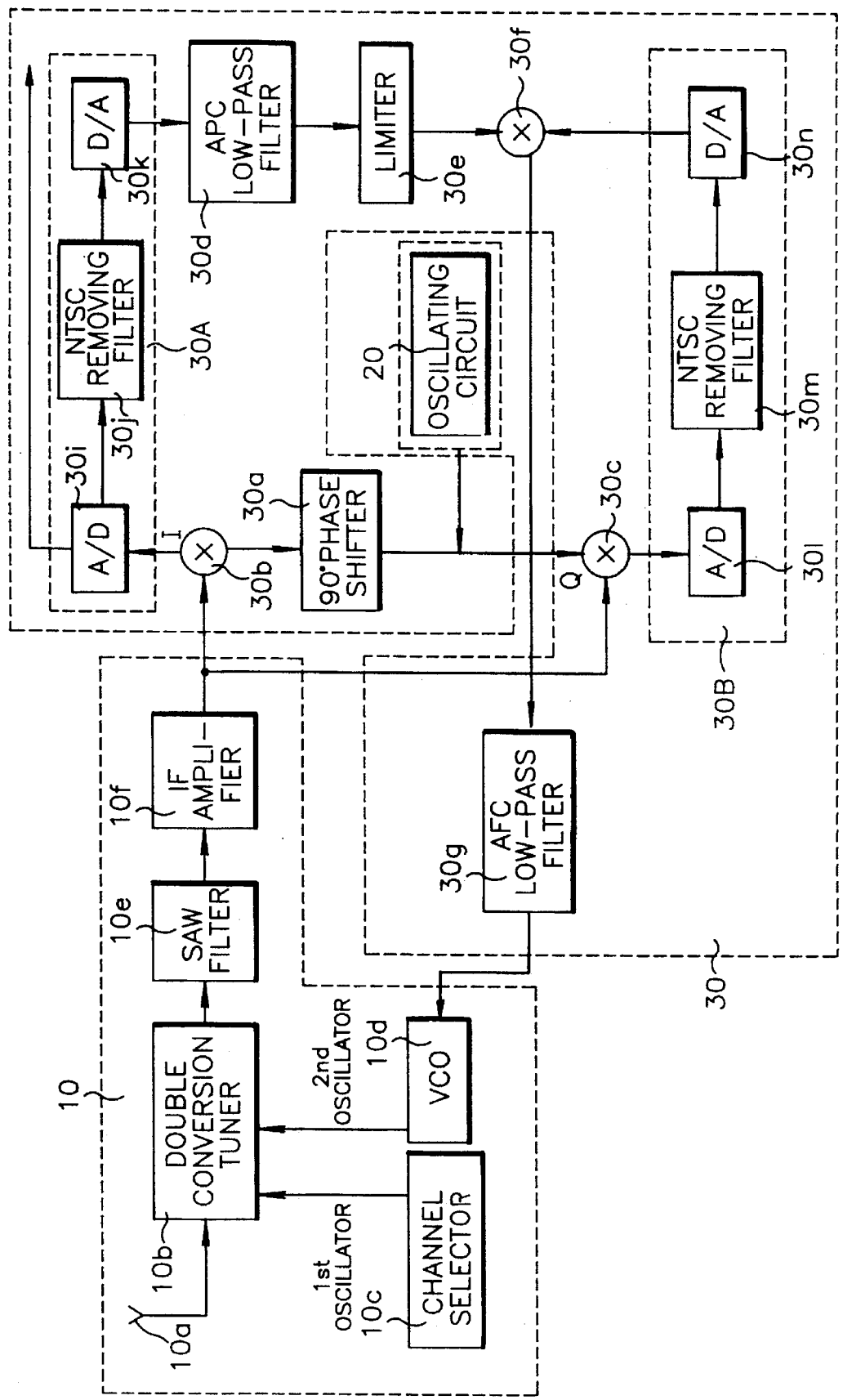
FIG. 7 is a block diagram of a conventional demodulating system for a HDTV for removing the interference of a NTSC video carrier.

The configuration of tuning circuit 10 and FPLL 30 is the same as those of FIGS. 1 and 7, as described above.

In FIG. 9, a general band-pass filter can be used for filtering circuit 40.

Out of the RF signals received by the antenna 10a, one signal is selected by the double conversion tuner 10b, according to a first oscillating frequency provided a from channel selector 10c, and the selected signal is converted into a first IF signal.

In response to the loop-controlling signal input from the double conversion tuner 10b, the frequency of the first IF signal is converted into a second IF signal according to a second oscillating frequency provided from VCO 10d. The second IF signal is corrected into a final IF signal of an adequate magnitude and frequency by the SAW filter 10e and the IF amplifier 10f.

The output signal of the IF amplifier 10f is supplied to the multiplier 50 and the filter 40.

The final IF signal is multiplied by the sine wave signal output from the oscillating circuit 20, a reference oscillator, and phase-shifted by 90° by phase shifter 30a of FPLL 30 in multiplier 50. The multiplied signal is converted into a low-band signal.

This low-band signal is converted into a digital signal in A/D converter 60 and used as an input signal to a succeeding digital signal processing port.

As shown in FIG. 8, for FPLL 30, HDTV information data and NTSC video carrier are meaningless. FPLL 30 requires only the pilot signal including the HDTV carrier information.

For this reason, if the NTSC broadcasting signal is present in the same channel, it is preferred that the HDTV information data and NTSC video carrier are removed.

In this invention, a band-pass filter, filtering circuits 40, is coupled to the output port of the IF amplifier 10f.

FIG. 8 shows the characteristics of the frequency spectrum of the band-pass filter when only the pilot signal of the HDTV is passed and the remainder is canceled. Sharply defined edges to the spectrum are not vital. Therefore, an expensive band-pass filter is not necessary.

FPLL 30, using the pilot signal output by the filtering circuit 40 as an input signal, performs the same algorithm as the conventional FPLL 30 of FIGS. 1 and 7, thereby providing a loop-controlling signal for synchronizing the phase and frequency of the carrier corresponding to a selected HDTV channel and the phase and frequency of the sine wave signal output from the oscillating circuit 20, a reference oscillator, to VCO 10$d$ of the tuning circuit 10.

The sine wave signal output from the oscillating circuit 20 and the pilot signal indicative of the carrier output from the filtering circuit 40 are converted into an I-channel beat signal and a Q-channel beat signal, both of which are low-band signals, by using the phase shifter 30$a$ and the multipliers 30$b$ and 30$c$. The I-channel beat signal is processed through the APC low-pass filter 30$d$ and the limiter 30$e$.

The I-channel beat signal output from the limiter 30$c$ is multiplied by the Q-channel beat signal in the multiplier 30$f$ to form an FPLL controlling signal, i.e., a loop-controlling signal. The multiplied signal is fed to VCO 10$d$ of tuning circuit 10 via the APC low-pass filter 30$g$.

The present invention provides several benefits. First, the present invention can be used directly with America's HDTV grand alliance transmission system.

Second, with a band-pass filter being inserted on the output side of the IF signal, the jitter of the FPLL can be reduced by removing any unnecessary information data besides the pilot signal.

Third, even if a common channel interference is present in a low-band HDTV signal due to a NTSC broadcasting signal, the interference can be simply canceled with an analog band-pass filter tied to the IF signal output port. This simplifies the conventional process in which the low-band signal passes an A/D converter, a digital comb filter serving as an NTSC removing filter, and a D/A converter. Further, this simplifies the configuration of the FPLL.

Fourth, a digital comb filter and a D/A converter are not required elements. This removes the possibility of noise creation due to the mingling of a digital signal and an analog signal.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A demodulating system for a high definition television (HDTV) comprising:

a tuning system for selecting one out of a plurality of received radio frequency (RF) signals and for converting the selected signal into an intermediate frequency (IF) signal according to an input loop-controlling signal;

an oscillating circuit for generating a sine wave signal;

filtering means for passing only a pilot signal containing HDTV carrier information filtered out of said IF signal and canceling any remaining signals; and frequency and phase locked loop (FPLL) means for using a predetermined algorithm to determine a loop-controlling signal for synchronizing the frequency and phase of said pilot signal and the frequency and phase of said sine wave and outputting said loop-controlling signal to said tuning system.

2. A demodulating system for a HDTV as claimed in claim 1, further comprising:

a multiplier for multiplying said sine wave signal phase-shifted by a predetermined angle in said FPLL means and output from said oscillating circuit by the IF signal output from said tuning circuit, thereby forming a low-band signal; and an analog-to-digital (A/D) converter for converting said low-band signal output from said multiplier into a digital signal.

3. A demodulating system for a HDTV as claimed in claim 1, wherein said loop-controlling signal output by said FPLL means synchronizes the frequency and phase of said sine wave signal output from said oscillating circuit and the phase and frequency of the pilot signal output from said filtering means.

4. A demodulating system for a HDTV as claimed in claim 1, wherein said filtering means is a band-pass filter 5. A demodulating system for a HDTV as claimed in claim 1, wherein said tuning system comprises:

an antenna for receiving said plurality of RF signals;

a double conversion tuner;

a channel selector for serving as a first oscillator for, according to a user's selection, selecting one of said RF signals received by said double conversion tuner and converting the selected RF signal into a first intermediate frequency signal;

a voltage controlled oscillator (VCO) for serving as a second oscillator for converting said first intermediate frequency signal into a second intermediate frequency signal of a frequency band for use in a general circuit and for outputting said second intermediate frequency signal to said double conversion tuner;

a SAW filter for filtering the second intermediate frequency signal output by said double conversion tuner; and an intermediate frequency amplifier for amplifying the second intermediate frequency signal output from said SAW filter.

6. A demodulating system for a HDTV as claimed in claim 1, wherein said FPLL comprises:

a phase shifter for shifting the phase of said sine wave output from said oscillating circuit by a predetermined angle;

a first multiplier for multiplying a second intermediate frequency signal output from the tuning system by the output signal of said phase shifter and outputting the product as an I-channel beat signal;

a second multiplier for multiplying said sine wave signal output from said oscillating circuit by the second intermediate frequency signal output from said tuning system and outputting the product as a Q-channel beat signal;

an automatic filtering control (AFC) low-pass filter for passing only a predetermined low band of said I-channel beat signal and changing the phase of the signal according to the frequency of said I-channel beat signal;

a limiter for amplifying and limiting the output signal of said AFC low-pass filter;

a third multiplier for multiplying the output signal of said second multiplier by the output signal of said limiter; and an automatic phase control (APC) low-pass filter for passing only a predetermined low frequency band of the output signal of said third multiplier and providing the passed signal to a voltage controlled oscillator (VCO) in said tuning system, as a loop-controlling signal for use in converting the selected signal into said intermediate frequency signal.

* * * * *